(12) United States Patent
Shin

(10) Patent No.: US 8,031,141 B2
(45) Date of Patent: Oct. 4, 2011

(54) SCAN DRIVING CIRCUIT AND ORGANIC LIGHT EMITTING DISPLAY USING THE SAME

(75) Inventor: Dong Yong Shin, Seoul (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1267 days.

(21) Appl. No.: 11/706,397

(22) Filed: Feb. 15, 2007

(65) Prior Publication Data

US 2007/0240024 A1    Oct. 11, 2007

(30) Foreign Application Priority Data

Apr. 6, 2006  (KR) .......................... 10-2006-0031636

(51) Int. Cl.
   *G09G 3/30* (2006.01)
(52) U.S. Cl. ............. 345/76; 345/99; 345/100; 345/204
(58) Field of Classification Search .................... 345/204, 345/76–83, 98–100; 315/169.3
   See application file for complete search history.

(56) References Cited

U.S. PATENT DOCUMENTS

| | | | |
|---|---|---|---|
| 6,556,646 B1 | 4/2003 | Yeo et al. | |
| 7,057,589 B2 | 6/2006 | Shin et al. | |
| 7,256,775 B2 | 8/2007 | Eom | |
| 7,656,194 B2 | 2/2010 | Shin | |
| 7,663,580 B2 | 2/2010 | Shin | |
| 2003/0201955 A1 | 10/2003 | Song et al. | |
| 2005/0151715 A1* | 7/2005 | Chegal | 345/100 |
| 2005/0264496 A1 | 12/2005 | Shin | |
| 2005/0285824 A1* | 12/2005 | Shin | 345/76 |
| 2005/0285827 A1* | 12/2005 | Eom | 345/76 |
| 2006/0156121 A1 | 7/2006 | Chung | |
| 2007/0079191 A1 | 4/2007 | Shin | |

FOREIGN PATENT DOCUMENTS

| | | |
|---|---|---|
| CN | 1 713 260 A | 12/2005 |
| EP | 1 610 293 | 12/2005 |
| EP | 1 764 774 A2 | 3/2007 |
| JP | 11-282426 A | 10/1999 |
| JP | 2002-352593 A | 12/2002 |
| JP | 2005-338837 A | 12/2005 |
| JP | 2006-011368 A | 1/2006 |
| JP | 2006-018274 A | 1/2006 |
| JP | 2006-072321 A | 3/2006 |
| JP | 2006-195459 A | 7/2006 |
| JP | 2007-086727 A | 4/2007 |
| JP | 2007-128631 A | 5/2007 |
| KR | 10-2003-0075946 | 9/2003 |
| KR | 10-2003-0081610 | 10/2003 |
| KR | 10-2003-0095135 | 12/2003 |
| KR | 10-2003-0096878 | 12/2003 |
| KR | 2005 0121357 | 12/2005 |

* cited by examiner

*Primary Examiner* — Seokyun Moon
(74) *Attorney, Agent, or Firm* — Lee & Morse, P.C.

(57) ABSTRACT

A scan driving circuit includes a first scan driver including a plurality of first units, the first units receiving an input signal or an output voltage of a previous first unit and first and second clock signals to output a scan signal, and a second scan driver having a plurality of second units, the second units receiving a plurality of scan signals output from respective ones of the first units, and at least one of the first and second clock signals, and outputting an emission control signal.

19 Claims, 6 Drawing Sheets

SCAN DRIVING CIRCUIT AND ORGANIC LIGHT EMITTING DISPLAY USING THE SAME

BACKGROUND OF THE INVENTION

1. Field of the Invention

The present invention relates to an organic light emitting display. More specifically, the present invention relates to a scan driving circuit employable in a current driven type organic light emitting display.

2. Description of the Related Art

Various types of flat panel displays are being developed. Flat panel display devices are more commonly replacing cathode ray tubes (CRTs) because flat panel display devices may be made to be thinner, have less volume, and/or be lighter than (CRTs). Flat panel displays include, e.g., a liquid crystal display (LCD), a field emission display (FED), a plasma display panel (PDP) and an organic light emitting display (OLED), etc.

Amongst the flat panel displays, organic light emitting displays generally display an image using an organic light emitting diode (OLED) that generates light by the recombination of an electron and a hole. Such an organic light emitting display is advantageous because it has a relatively rapid response time, and may be driven with a relatively lower amount of power. Organic light emitting displays generally enable an organic light emitting diode to emit light by supplying a current corresponding to a data signal into the organic light emitting diode using a transistor formed in every pixel.

Such a conventional organic light emitting display may include a data driver for supplying a data signal to data lines, a scan driver for sequentially supplying a scan signal to the scan lines, an emission control driver for supplying an emission control signal to an emission control line, and a pixel unit including a plurality of pixels connected with the data lines, the scan lines and the emission control line.

The pixels included in the pixel unit may be selected when a scan signal is supplied to the scan line to receive a data signal from the data line. The pixels receiving the data signal display a predetermined image while generating the light of a predetermined luminance corresponding to the data signal. An emission time of the pixels is controlled by the emission control signal supplied from the emission control line.

The scan driver or the emission control driver should be mounted on a panel in order to reduce the size, weight and manufacturing cost of the OLED device, particularly as larger OLED panels are being developed.

However, it is difficult to mount a conventional scan driver or emission control driver on a panel because the conventional scan driver or emission control driver is composed of PMOS transistors and NMOS transistors. Also, it is difficult to drive a conventional emission control driver at a high speed because the conventional emission control driver generates an output signal per at least one cycle of a clock signal. Also, the conventional scan driver or emission control driver composed of the PMOS transistors and the NMOS transistors has a relatively high level of power consumption because a predetermined static current flows when an output signal is generated.

SUMMARY OF THE INVENTION

The present invention is therefore directed to a scan driving circuit, which substantially overcomes one or more of the problems due to the limitations and disadvantages of the related art.

It is therefore a feature of an embodiment of the present invention to provide a scan driving circuit that minimizes or reduces power consumption relative to conventional scan driving circuits.

It is therefore a separate feature of an embodiment of the present invention to provide a scan driving circuit that compensates for a non-uniform luminance distribution by compensating for a threshold voltage of a transistor.

It is therefore a separate feature of an embodiment of the present invention to provide a scan driving circuit that generates an emission control signal based on a scan signal(s).

It is therefore a separate feature of an embodiment of the present invention to provide a scan driving circuit that includes a second scan driver having a low amount of power consumption.

It is therefore a separate feature of an embodiment of the present invention to provide a scan driving circuit that eliminates a path through which static current may flow.

At least one of the above and other features and advantages of the present invention may be realized by providing a scan driving circuit, including a first scan driver including a plurality of first units, the first units receiving an input signal or an output voltage of a previous first unit and first and second clock signals to output a scan signal, and a second scan driver having a plurality of second units, the second units receiving a plurality of scan signals output from respective ones of the first units, and at least one of the first and second clock signals, and outputting an emission control signal.

The two scan signals may be sequentially output from respective ones of the first units. Each of the first units of the first scan driver may include a first transistor including a first terminal receiving an output voltage of a previously operated first unit or initial input signal, a gate terminal connected to a first clock terminal, and a second terminal, a second transistor including a gate terminal connected to the second terminal of the first transistor, a first terminal connected to a second clock terminal, and a second terminal connected to an output terminal for outputting the respective scan signal, a third transistor including a gate terminal connected to the first clock terminal, a first terminal connected to a first node, and a second terminal connected to a second power supply, a fourth transistor including a gate terminal connected to the second terminal of the first transistor, a first terminal connected to the first clock terminal, and a second terminal connected to the first node, and a fifth transistor including a gate terminal connected to the first node, a first terminal connected to the first power supply, and a second terminal connected to the output terminal.

The scan driving circuit may include a first capacitor connected between the second terminal of the first transistor and the output terminal. Each of the first, second, third, fourth and fifth transistors may be a P-type transistor.

Each of the first units of the first scan driver may include a first clock terminal and a second clock terminal, the first clock terminal receiving one of a first clock signal and a second clock signal, and the second clock terminal receiving the other of the first clock signal and the second clock signal.

The first clock signal may be supplied to the first clock terminal of odd-numbered first units of the first scan driver, and the second clock signal is supplied to the second clock terminal of odd-numbered first units of the first scan driver. The second clock signal may be supplied to the first clock terminal of even-numbered first units of the first scan driver, and the first clock signal is supplied to the second clock terminal of the even-numbered first units of the first scan driver.

A precharge may be carried out during a period when the first clock signal is input at a low level and the second clock signal is input at a high level, and an evaluation is carried out during a period when the first clock signal is input at a high level and the second clock signal is input at a low level.

The first clock signal and the second clock signal may have a reversed phase relationship, and may overlap each other at a high level such that the first and second clock signals are high level signals during at least one predetermined period of time.

During the precharge period, a high level may be output from the first respective first unit, and during the evaluation period, a level of a signal corresponding to the input received during the precharge period may be output from the respective first unit, when the first and second clock signals are overlapped at a high level, a previous output may be maintained if the overlapping high level period of the first and second clock signals followed a precharge period, and when the first and second clock signals are overlapped at a high level, a high level may be output if the overlapping high level period of the first and second clock signals followed an evaluation period.

Each of the second units of the second scan driver may include a first switching element connected between a first power supply and an output terminal for outputting the respective emission control signal, a second switching element including a first terminal connected to the output terminal and a second terminal connected to the second power supply, a first capacitor connected to a first node connected to a gate terminal of the second switching element and the output terminal, a third switching element including a first terminal connected to the first node, a second terminal connected to the output terminal, the third switching element receiving the plurality of scan signals, and a fourth switching element that may include a first terminal connected to the first node and a second terminal connected to the second power supply, and may include a gate terminal connected to an output terminal of a conversion unit.

Each of the first and third switching elements may be realized by a transistor having a transmission gate structure realized by connecting two transistors.

The conversion unit may include a fifth switching element including a first terminal connected to the first power supply and a second terminal connected to a third node, a sixth switching element including a first terminal connected to the third node, a seventh switching element including a first terminal connected to an output terminal of the conversion unit, and a gate terminal connected to the third node, and a second capacitor connected between the third node and the output terminal of the conversion unit.

Each of the second units of the second scan driver may include an eighth switching element including a first terminal connected to the first power supply and a second terminal connected to the output terminal of the conversion unit.

A gate electrode of the eighth switching element may be connected to a scan signal input line for receiving one of the scan signals or an input line for receiving the first clock signal. The first, second, third, fourth, fifth, sixth, seventh and eighth switching elements may be P-type elements.

A gate electrode of the fifth switching element may be connected to a scan signal input line for receiving one of the plurality of scan signals, and a gate electrode of the sixth switching element is connected to a second scan signal input line for receiving another one of the plurality of scan signals or an input line for receiving the first clock signal.

A second terminal of the sixth switching element may be connected so as to receive one of the scan signals other than a respective one of the scan signals supplied to the fifth switching element or the first clock signal, a gate terminal of the sixth switching element may be connected so as to receive one of the scan signals other than a respective one of the scan signals supplied to the fifth switching element or the first clock signal, and a second terminal of the seventh switching element may be connected so as to receive the second clock signal.

At least one of the above and other features and advantages of the present invention may be separately realized by providing a light emitting display, including a pixel unit including a plurality of pixels connected with respective ones of signal lines, data lines and emission signal lines, a data driving circuit supplying a respective data signal into the data lines, and a scan driving circuit including a first scan driver including a plurality of first units, the first units receiving an input signal or an output voltage of a previous first unit and first and second clock signals to output a scan signal, and a second scan driver having a plurality of second units, the second units receiving a plurality of scan signals output from respective ones of the first units, and at least one of the first and second clock signals, and outputting an emission control signal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
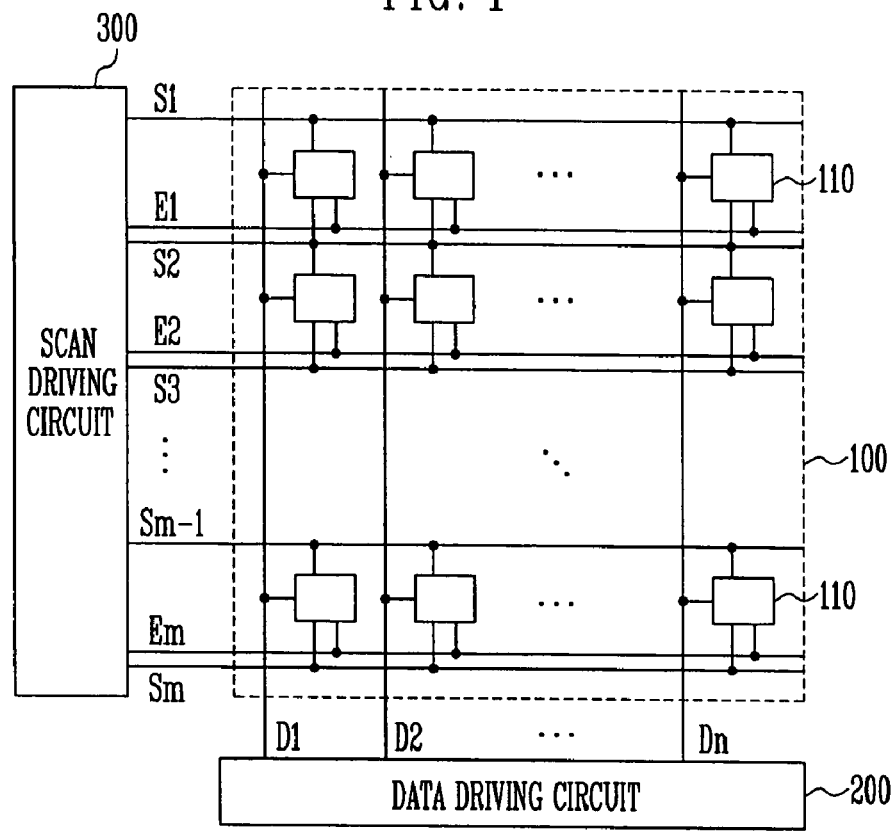
FIG. 1 illustrates a schematic view of an exemplary organic light emitting display employable with one or more aspects of the invention.

Korean Patent Application No. 10-2006-0031636, filed on Apr. 6, 2006, in the Korean Intellectual Property Office, and entitled: "Scan Driving Circuit and Organic Light Emitting Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. Like reference numerals refer to like elements throughout.

FIG. 1 illustrates a schematic view of an exemplary organic light emitting display employable with one or more aspects of the invention.

Referring to FIG. 1, the organic light emitting display may include an image displaying unit 100, a data driving circuit 200, and a scan driving circuit 300. The image displaying unit 100 may display an image(s). The data driving circuit 200 may transmit a data signal(s), and the scan driving circuit 300 may supply a scan signal and an emission control signal.

The image displaying unit 100 may include a plurality of data lines $D_1$-$D_n$ extending along a horizontal direction, a plurality of signal lines $S_1$-$S_m$, $E_1$-$E_m$ extending along a vertical direction, and a plurality of pixels 110 arranged in a matrix-like manner.

The signal lines may include a plurality of scan signal lines $S_1$-$S_m$ for transmitting a scan signal to select a pixel 110, and a plurality of emission control signal lines $E_1$-$E_m$ for transmitting an emission control signal to control an emission period of an organic EL device.

One of the pixels 110 may be formed at each pixel region respectively defined by the data lines $D_1$-$D_n$, the scan lines $S_1$-$S_m$, and the emission control signal lines $E_1$-$E_m$.

Figure 2:
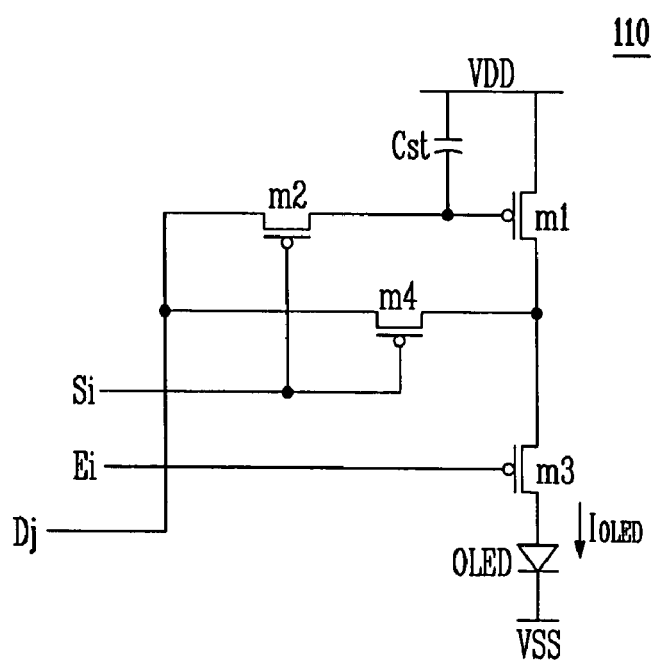
FIG. 2 illustrates a circuit diagram of an exemplary embodiment of a pixel employable by of the exemplary organic light emitting display as shown in FIG. 1.

FIG. 2 illustrates a circuit diagram of an exemplary embodiment of the pixel 110 that may be employed at one, some or every pixel region of, e.g., the exemplary organic light emitting display shown in FIG. 1. More particularly, the exemplary pixel 110 illustrated in FIG. 2 is illustrated and described as a j–$i^{th}$ pixel connected to a $j^{th}$ data line $D_j$ and $i^{th}$ scan and emission control signal lines $S_i$, $E_i$, but may be any pixel of the image displaying unit 100.

As shown in FIG. 2, the pixel 110 according to one embodiment of the present invention may include an organic EL device OLED, transistors m1-m4, and a capacitor Cst. A PMOS transistor may be used as the transistors m1-m4, but the invention is not limited thereto.

The first transistor m1 may be connected between a power supply VDD and an organic EL device OLED to control a current flowing to the organic EL device. A source of the first transistor m1 may be connected to the power supply VDD, and a drain of the first transistor m1 may be connected to an anode of the organic EL device OLED via the third transistor m3.

The second transistor m2 and the fourth transistor m4 may turn on in response to a scan signal from the scan signal line $S_i$. The second transistor m2 may transmit a data signal from the data line $D_j$ to a gate of the first transistor m1. The fourth transistor m4 together with second transistor m2 may connect the gate and the drain of the first transistor m1 such that the first transistor m1 may be diode-connected in response to the scan signal.

The capacitor Cst may be connected between the gate and the source of the first transistor m1, and may charge a voltage corresponding to a data current $I_{DATA}$ from the data line $D_j$. The third transistor m3 may transmit a current flowing from the first transistor m1 to an organic EL device OLED in response to the emission control signal from the emission control signal lines $E_i$.

Figure 3:
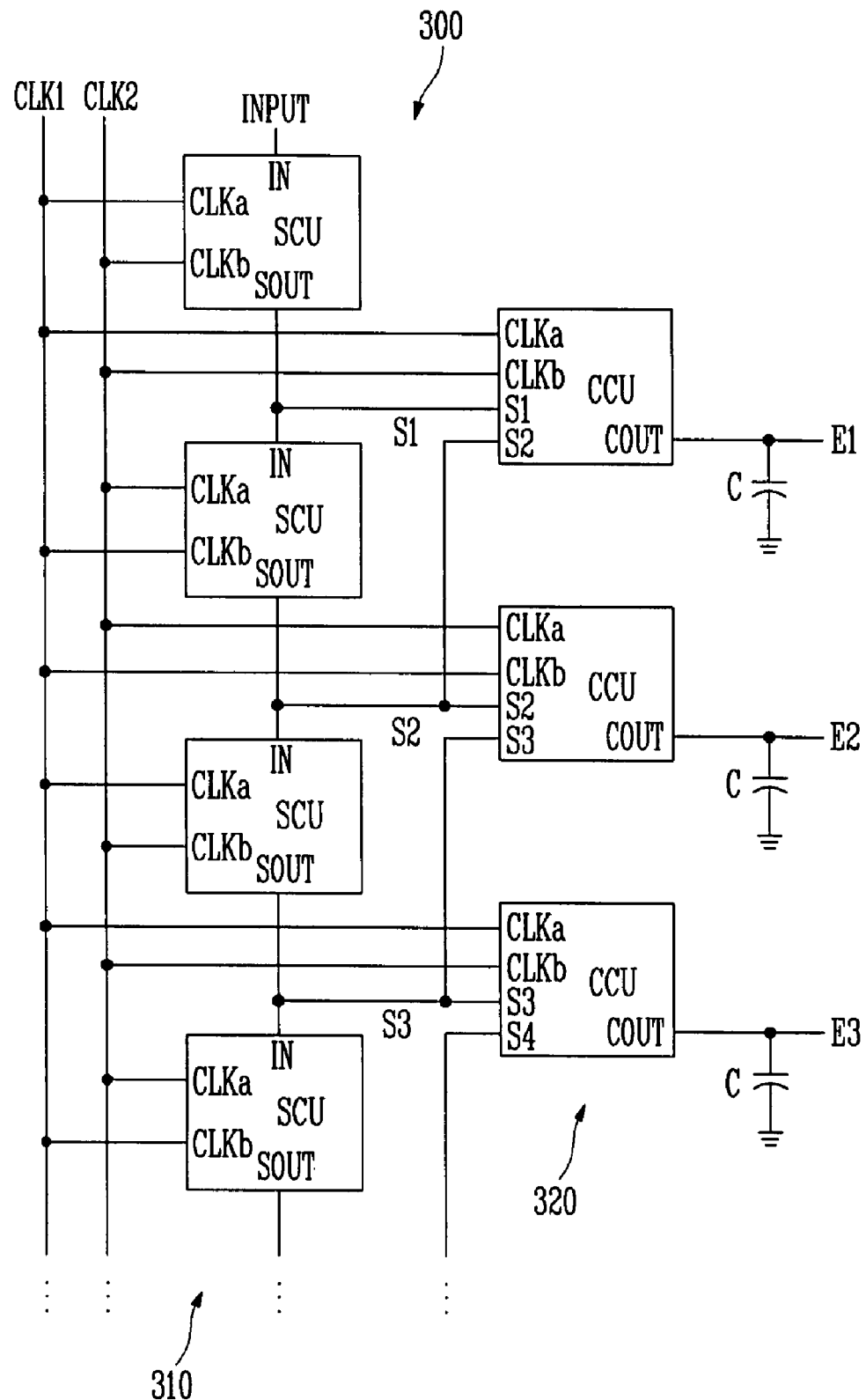
FIG. 3 illustrates a block diagram of an exemplary embodiment of a scan driving circuit employing one or more aspects of the invention.

FIG. 3 illustrates a block diagram of an exemplary embodiment of a scan driving circuit 300 employing one or more aspects of the invention.

Referring to FIG. 3, the scan driving circuit 300 may include a first scan driver 310 for outputting a scan signal and a second scan driver 320 for receiving the scan signal and outputting an emission control signal. The first scan driver 310 may generate and supply the scan signal(s), and the second scan driver 320 may generate and supply the emission control signal(s).

The data driving circuit 200 may apply a data current $I_{DATA}$ to the data lines $D_1$-$D_n$, and the first scan driver 310 of the scan driving circuit 300 may sequentially apply a scan signal to the scan signal lines $S_1$-$S_m$. The scan signal(s) may be used for selecting a corresponding one(s) of the pixels 110. The second scan driver 320 of the scan driving circuit 300 may sequentially apply an emission control signal to the emission control signal lines $E_1$-$E_m$, the emission control signal(s) may be used for controlling a luminance of the corresponding one of the pixels 110.

The first scan driver 310 may include n S units SCU1 to SCUn. More particularly, an initial input signal INPUT may be supplied to an input terminal IN of a first one SCU1 of the S units SCUs, and output signals of the first to n–$1^{st}$ S units SCUs may be respectively supplied as an input signal to an input terminal IN of the second to nth one SCU2 of the S units SCUs.

Each of the S units SCUs may include a first clock terminal CLKa into which one of input clock signals, e.g., one of first and second clock signals CLK1, CLK2, may be supplied and a second clock terminal CLKb into which another one of the input clock signals, e.g., the other of the first and second clock signals CLK1, CLK2, may be supplied.

The first and second clock signals CLK1, CLK2 may have at least one overlapping same level portion and at least one overlapping different level portion. For example, during a same period of time, at least one predetermined portion of each of the first clock signal CLK1 and second clock signal CLK2 may have a same level, i.e., a high level, and at least one other portion of each of the first clock signal CLK1 and the second clock signal CLK2 may have a different level, i.e., the first clock signal CLK1 may be at one of a high level and a low level while the second clock signal CLK2 may be at the other of a relatively high level and a relatively low level.

In embodiments of the invention, the first clock signal CLK1 may be supplied to the first clock terminal CLKa of odd-numbered ones of the S units SCUs, and the second clock signal CLK2 may be supplied to the second clock terminal CLKb of the odd-numbered ones of the S units SCUs, while the second clock signal CLK2 may be supplied to the first clock terminal CLKa of even-numbered ones of the S units SCUs, and the first clock signal CLK1 may be supplied to the second terminal CLKb of the even-numbered ones of the S units SCUs.

Each of the S units SCUs receiving the initial input signal IN or the output voltage of the previous S unit SCU and the first and second clock signals CLK1, CLK2 may sequentially output an output signal to an output terminal SOUT of the respective S unit SCU. More particularly, in embodiments of the invention, each of the S units SCUs may, in response to the initial input signal INPUT or the output voltage of the previous S unit SCU and the first and second clock signals CLK1, CLK2 supplied thereto, at least temporarily change a voltage pattern or level, e.g., change from a high level voltage to a low level voltage, of an output signal being supplied to an output terminal SOUT of the respective S unit SCU.

Referring to FIG. 3, the second scan driver 320 may include n C units CCU1 to CCUn. Each of the C units CCUs may receive a plurality of scan signals, e.g., two scan signals, and at least one clock signal, e.g., the first and/or second clock signals CLK1, CLK2 from the first driver 310, and may output an emission control signal to an output terminal COUT of the respective C unit CCU. More particularly, e.g., an nth one CCUn of the C units CCUs may respectively receive an nth one of the scan signals and an n+1$^{th}$ one of the scan signals, e.g., S1 and S2 or S2 and S3, or another signal, etc., and the first and second clock signals CLK1, CLK2 from the first driver 310, and may generate and supply an nth one of the emission signals to the output terminal COUT of the nth C unit CCUn.

Each of the C units CCUs may include a first clock terminal CLKa into which one of the first and second clock signals CLK1, CLK2 may be supplied and a second clock terminal CLKb into which the other one of the first and second clock signals CLK1, CLK2 may be supplied. The first and second clock signals CLK1, CLK2 may be phase-shifted or phase-reversed relative to each other.

In embodiments of the invention, the first clock signal CLK1 may be supplied to the first clock terminal CLKa of odd-numbered ones of the C units CCUs, and the second clock signal CLK2 may be supplied to the second clock terminal CLKb of the odd-numbered ones of the C units CCUs. In other embodiments, e.g., the second clock signal CLK2 may be supplied to the first clock terminal CLKa of even-numbered ones of the C units CCUs, and the first clock signal CLK1 may be supplied to the second terminal CLKb of the even-numbered ones of the C units CCUs.

As shown in FIG. 3, in some embodiments of the invention, e.g., the first and second clock signals CLK1, CLK2, and scan signals S1, S2 that may be output from the first and second ones of S units SCU1, SCU2 of the first scan driver 310, e.g., from the respective output terminal SOUT, may be input into a first one CCU1 of the C units CCUs of the second scan driver 320, as shown in FIG. 3.

In some embodiments of the invention, the first and/or second clock signals CLK1, CLK2 may be independently input into each of the C units CCUs of the second scan driver 320, and at least one of the respective scan signals, e.g., at least one of the nth and the n+1$^{th}$ scan signals, may be independently input into the respective S units SCUs of the second scan driver 320.

The output line from each of the C units CCUs of the second scan driver 320 may include a predetermined capacitor C connected thereto, as shown in FIG. 3.

In embodiments of the invention, the scan signal output from the first scan driver 310 may be configured so that it can be input into the image displaying unit 100 through a separate line without passing through the second scan driver 320. That is, in embodiments of the invention, e.g., the scan driving circuit 300 employing one or more aspects of the invention may be configured to supply only the output signal, e.g., emission control signal(s), of the second scan driver 320 to the image displaying unit 100.

In other embodiments of the invention, the scan driving circuit 300 may be configured to supply the output signal(s), e.g., emission control signal(s) and the scan signal, output from the first scan driver 310, to the image displaying unit 100. In such embodiments, the scan signal(s) output from the first scan driver 310 and the emission control signal(s) may be input to the image displaying unit 100 via the scan second driving circuit 320. Thus, in embodiments of the invention, the scan driving circuit 300 may simultaneously and/or substantially simultaneously supply the scan signal(s) and the emission control signal(s) to the image displaying unit 100.

Figure 4:
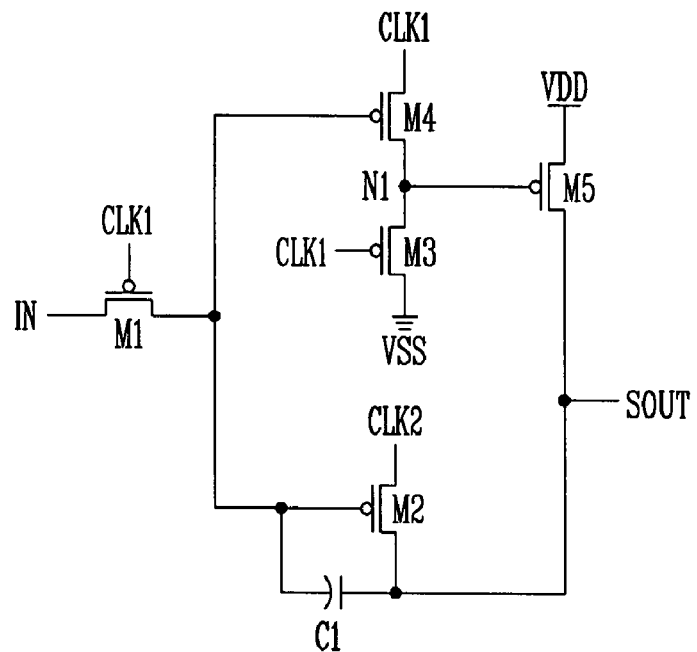
FIG. 4 illustrates a circuit diagram of an exemplary embodiment of an S unit (SCU) of a first scan driver of the exemplary scan driving circuit shown in FIG. 3.
Figure 5:
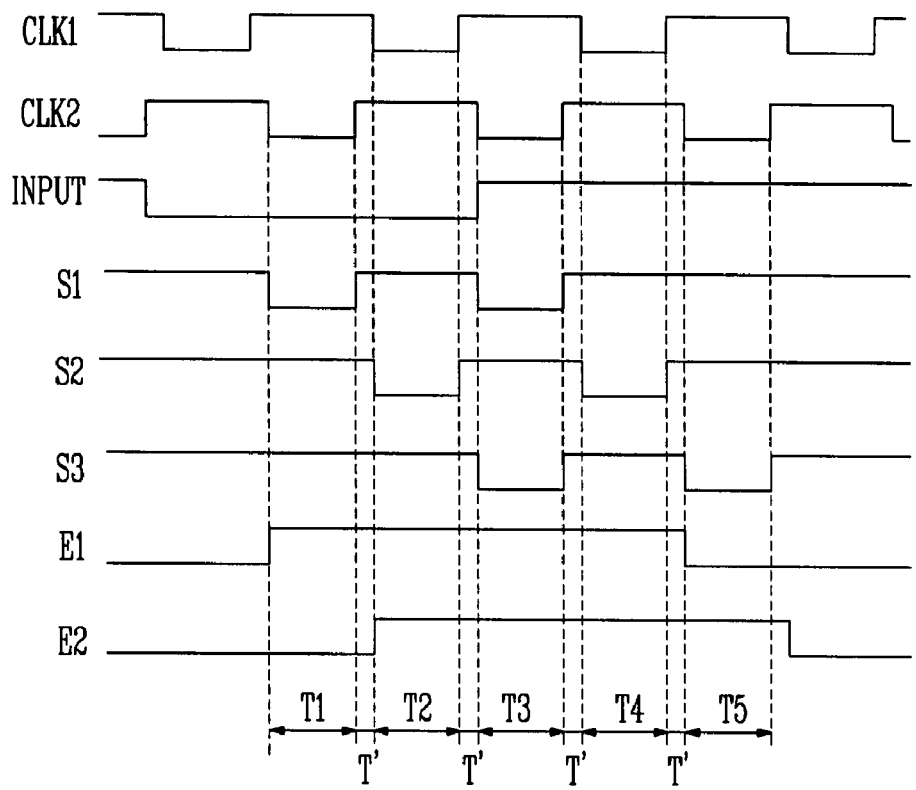
FIG. 5 illustrates an exemplary timing diagram of exemplary signal waveforms that may be input to/output from the scan driving circuit shown in FIG. 3.

FIG. 4 illustrates a circuit diagram of an exemplary embodiment of the S unit SCU of the first scan driver 310 of the exemplary scan driving circuit 300 shown in FIG. 3. FIG. 5 illustrates an exemplary timing diagram of exemplary signal waveforms that may be input to/output from the scan driving circuit shown in FIG. 3

Referring to FIGS. 4 and 5, one, some or all of the S units SCUs of the first scan driver 310 may carry out a precharge operation during a first period, e.g., a period when the input clock signals CLK1, CLK2 have different levels relative to one another, and may perform an evaluation during a second period, e.g., when the phase of the input clock signals are reversed relative to the first period. In embodiments of the invention, the second period may immediately follow the first period. In embodiments of the invention, the input clock signals CLK1, CLK2 may sequentially output a low level pulse based on intermediate time intervals during which the input clock signals CLK1, CLK2 may be overlapped at a high level.

More particularly, in some embodiments of the invention, during the precharge period, an output signal that may be output from the S unit SCU may have a high level, and during the evaluation period, a signal corresponding to the input received during the precharge period may be output.

In some embodiments of the invention, an evaluation period and/or a precharge period of the even numbered ones of the S units SCUs may correspond to a same amount of time as that of an evaluation period and/or a precharge period of the odd numbered ones of the S units SCUs, respectively.

An operation of an exemplary S unit SCU will be described in detail with reference to the circuit diagram of the exemplary first scan driver 310 shown in FIG. 4. The exemplary S unit SCU may be employed for one, some or all of the S units SCUs of the first scan driver 310 of the scan driving circuit 300.

In the following description of exemplary embodiments, a PMOS thin film transistor will be described as one example of the transistor provided in the S unit SCU, but embodiments of the present invention are not limited thereto.

Referring to FIG. 4, the exemplary S unit SCU employable by the first scan driver 310 may include a first PMOS transistor M1, a second PMOS transistor M2, a third PMOS transistor M3, a fourth PMOS transistor M4, and a fifth PMOS transistor M5. The S unit SCU may also include a first capacitor C1.

The first PMOS transistor M1 may receive an initial input signal INPUT at a first terminal thereof, which may correspond to the input terminal IN of the S unit SCU. A gate terminal of the first PMOS transistor M1 may be connected to the first clock terminal CLKa.

A second PMOS transistor M2 may have a gate terminal thereof connected to a second terminal of the first PMOS transistor M1. A first terminal of the second PMOS transistor M2 may be connected to the second clock terminal CLKb. A second terminal of the second PMOS transistor M2 may be connected to the output terminal SOUT and may supply the respective scan signal to the respective scan line S1 to Sn.

The third PMOS transistor M3 may have a gate terminal thereof connected to the first clock terminal CLKa. A first terminal of the third PMOS transistor may be connected to a first node N1 of the S unit, and a second terminal of the third PMOS transistor may be connected to a second power supply VSS.

The fourth PMOS transistor M4 may have a gate terminal thereof connected to the second terminal of the first PMOS transistor M1. A first terminal of the fourth PMOS transistor M4 may be connected to the first clock terminal CLKa and a second terminal of the fourth PMOS transistor M4 may be connected to the first node N1 of the S unit SCU.

The fifth PMOS transistor M5 may have a gate terminal thereof connected to the first node N1 of the S unit SCU. A first terminal of the fifth PMOS transistor M5 may be connected to a first power supply VDD and a second terminal of the fifth PMOS transistor M5 may be connected to the output terminal SOUT.

The first capacitor C1 may have a first terminal thereof connected to the second terminal of the first PMOS transistor M1 and a second terminal thereof connected to the output terminal SOUT.

Referring to FIGS. 4 and 5, if the S unit SCU is an odd-numbered S unit of the first scan driver 310, then a first clock signal CLK1 may be supplied to the first clock terminal CLKa, and a second clock signal CLK2 may be supplied to the second clock terminal CLKb. If the S unit SCU is an even-numbered S unit of the first scan driver 310, then a second clock signal CLK2 may be supplied to the first clock terminal CLKa, and a first clock signal CLK1 may be supplied to the second clock terminal CLKb.

The second power supply VSS may be a negative power supply or may be a ground terminal. In the exemplary embodiment illustrated in FIG. 4, the second power supply VSS is a ground terminal, but is not limited thereto.

Each of the S units SCUs may include a transfer portion, an inversion portion and a buffer portion. The transfer portion may include the first and second PMOS transistors M1, M2 and the first capacitor C1. The inversion portion may include the first, third and fourth PMOS transistors M1, M3, M4. The buffer portion may include the fifth PMOS transistor M5.

In some embodiments of the invention, a precharge period may correspond to a period during which the first clock signal (CLK1) is at a low level and the second clock signal (CLK2) is at a high level. In some embodiments of the invention, an evaluation period may correspond to a period during which the first clock signal (CLK1) is at a high level and the second clock signal (CLK2) is at a low level.

Thus, in some embodiments of the invention, during a precharge period, a respective one of the output signals, e.g., S1 to Sn, of the respective S unit may be a high level signal, and during an evaluation period, the respective one of the output signals, e.g., S1 to Sn, of the respective S unit may be a signal corresponding to the input received during the precharge period.

Referring to FIG. 4, in some embodiments of the invention, while a signal is input into each of the S units SCUs, the first and second clock signals CLK1, CLK2 may include at least one overlapping high level portion, i.e., when the first and second clock signals CLK1, CLK2 are high during a same period of time.

Accordingly, referring to FIGS. 3, 4 and 5, a pair of the first and second clock signals CLK1, CLK2 input into each of the n S units SCU1 to SCUn may sequentially output a low level signal portion at a predetermined time interval. The respective low level signal portions may correspond to time periods between overlapping high level portions of the first and second clock signals CLK1, CLK2. Successive ones of the overlapping high level portions of the first and second clock signals CLK1, CLK2 may define a predetermined time interval between output signals of respective ones of the S units SCUs of the first scan driver 310. Such predetermined intermediate time intervals with overlapping high level portions of the first and second clock signals CLK1, CLK2 between successive ones of the first and second scan signals, e.g., S1 and S2, of the first and second ones of the S units SCU1, SCU2, may help ensure a margin for clock skew or delay.

Referring to FIG. 4 and FIG. 5, an exemplary operation of the exemplary S unit SCU will be described. In the following description, it will be assumed that the exemplary S unit SCU is an odd-numbered, e.g., first, S unit SCU of the first scan driver 310.

In embodiments of the invention, the first and third transistors M1 and M3 may be turned on (ON) during the precharge period, e.g., a period when the first clock signal CLK1 is input at a low level and the second clock signal CLK2 is input at a high level. Thus, a respective input signal INPUT may be transferred to the gate terminals of the second and fourth transistors M2 and M4 of the respective S unit. If the input signal INPUT is a low level signal, then the second transistor M2 and the fourth transistor M4 may be turned on. If the second transistor M2 is turned on, the second clock signal CLK2, which may be a high during the precharge period, may be supplied to the output terminal SOUT, and if the fourth transistor M4 is turned on, the first clock signal CLK1, which may be a low level signal during the precharge period, may be supplied to the first node N1 of the S unit SCU. At the same time, the first clock signal CLK1, which may be a low level signal during the precharge period, may be supplied to the gate terminal of the third transistor M3, and thus, the second power supply voltage VSS, which may be a low level voltage, may be supplied to the gate terminal of the fifth transistor M5. Thus, as a result of the first clock signal CLK1, which may be a low level signal during the precharge period, supplied through the fourth transistor M4 and the low level voltage of the second voltage source VSS supplied through the third transistor M3, a low level voltage may be supplied to the gate terminal of the fifth transistor M5, and may thereby turn on the fifth transistor M5 during the precharge period. If the fifth transistor M5 is turned on, the first power supply voltage VDD, which may be a high level voltage, may be supplied to the output terminal SOUT. More particularly, during the precharge period, the output terminal SOUT may have a high level because of the first power supply voltage supplied through the fifth transistor M5 and/or the second clock signal CLK2, which may have a high level, during the precharge period.

Thus, in embodiments of the invention, the buffer unit, e.g., M5, of the S unit SCU may output a high level signal during the precharge period(s). More particularly, in embodiments of the invention, the buffer unit, e.g., M5, of the S unit SCU may output a high level signal during the precharge period(s) irrespective of whether the input signal INPUT was a low level or a high level signal. That is, during the precharge period when the first clock signal CLK1 having a low level is supplied to the first transistor M1 the first transistor M1 may be turned on and may supply the high level of the input signal INPUT to the second and fourth transistors M2, M4. Thus, in such cases, the second and fourth transistor M2, M4 may be turned off during the precharge period. However, the first clock signal CLK1 having a low level signal may be supplied to the gate terminal of the third transistor M3, and thus, the low level voltage of the second power supply VSS may be supplied to the fifth transistor M5, thereby enabling the fifth transistor to supply the high level of the first power supply voltage VDD to the output terminal SOUT.

Further, as discussed above, during the precharge period, an output voltage of the previous S unit SCU or the input signal INPUT may be stored in the first capacitor C1, and a low level voltage may be stored at the first node N1 of the S unit SCU.

Then, during the evaluation period, when the first clock signal CLK1 may have a high level, the first transistor M1 may be turned off. When the first transistor M1 is turned off, the respective input signal INPUT may be interrupted, the third and fourth transistors M3 and M4 may be turned off, and the second transistor M2 may be turned on or off based on the voltage stored in the capacitor C1.

More particularly, if the signal input during the precharge period, i.e., the output voltage of the previous S unit SCU or the input signal INPUT, is at a high level, then a signal level precharged during the precharge period may be maintained by the first capacitor C1 and the first node N1, and the buffer unit, e.g., the fifth transistor M5, may output a high level. In such cases, the second transistor M2 may be turned off as a high voltage may be supplied to the gate of the second transistor M2 as a result of the voltage stored in the capacitor C1 when the high level signal was input during the precharge period, i.e., the output voltage of the previous S unit SCU or the input signal INPUT, which had a high voltage level was supplied.

On the other hand, in cases in which the signal input during the precharge period, i.e., the output voltage of the S unit SCU or the input signal INPUT is at a low voltage level, then the second transistor M2 may be turned on based on the low level signal stored in the first capacitor C1. In such cases, when the second transistor M2 of the transfer unit, e.g., M1 and M2, is turned on, the second clock signal CLK2 having a low level may be output through an output terminal SOUT.

In embodiments of the invention, operation of the S unit may be controlled such that, during the evaluation period, the respective S unit SCU outputs a low level signal if the signal input during the previous precharge period, i.e., the output signal SOUT of the previous S unit SCU or the initial input signal INPUT, was at a low level, and outputs a high-level signal if the signal input during the previous precharge period, i.e., the output signal SOUT of the previous S unit SCU or the initial input signal INPUT was at a high level.

As described above, in embodiments of the invention, as the input signal INPUT or the output signal SOUT of the previous S unit SCU is input to the respective S unit SCU, the first and second clock signals include at least one overlapping high level portion, as illustrated, e.g., in FIG. 5. As discussed more particularly below, these predetermined overlapping high level portion(s) of the first and second clock signal CLK1, CLK2 may be employed to control, e.g., a voltage stored in the capacitor C1 and/or an output voltage SOUT of the respective S unit SCU.

For example, if the S unit SCU has just undergone a precharge period prior to the first and second clock signals CLK1, CLK2 overlapping at a high level, i.e., predetermined overlapping high level portion, then the first and third transistors M1 and M3 that may be controlled by the first clock signal CLK1 may be turned off during a subsequent overlapping intermediate period of the first and second clock signals CLK1, CLK2. More particularly, the first and third transistor M1 and M3 may be turned off because the first clock signal CLK1, having a high level during the overlapping intermediate period, may be supplied to the gate terminal thereof. Thus, a voltage stored in the first capacitor C1 may be maintained, and more particularly, a voltage corresponding to the output signal SOUT of the previous S unit SCU or the initial input signal INPUT may be maintained.

At other times when, e.g., the S unit SCU has undergone an evaluation period prior to the first and second clock signals CLK1, CLK2 overlapping at a high level, i.e., predetermined overlapping high level portion, then the first and third transistors M1 and M3 may remain turned off because the first clock signal CLK1, having a high level during the overlapping intermediate period, may be supplied to the gate terminal thereof. Further, during such an overlapping intermediate period of the first and second clock signals CLK1, CLK2 after an evaluation period, an operation state of the second transistor M2 may be maintained.

More particularly, after an evaluation period during which a voltage corresponding to the output signal SOUT of the previous S unit SCU or the initial input signal INPUT had a high level, the second transistor M2 may be maintained in an off state because a voltage at the gate terminal of the second transistor M2 may be at a high level. Thus, the low level of the second clock signal CLK2 may not be supplied to the output terminal SOUT, and a high-level output may be maintained by the buffer unit, e.g., M5.

More particularly, after an evaluation period during which a voltage corresponding to the output signal SOUT of the previous S unit SCU or the initial input signal INPUT had a low level, the second transistor may be maintained in an on state because a voltage at the gate terminal of the second transistor M2 may be at a low level, and may be floating, as a result of the voltage signal stored in the capacitor C1. Therefore, the second transistor M2 may remain turned on, and may supply a low level signal to the output terminal SOUT while the second clock signal CLK2 has a low level, and may then change to a high level signal when the second clock signal CLK2 changes to a high level and the first clock signal CLK1 changes to a low level, e.g., for a subsequent precharge operation or a subsequent overlapping high level period of the clock signals CLK1, CLK2. Thus, after an evaluation operation, depending on the voltage stored in the capacitor C1, the output terminal SOUT may correspond to a level of the second clock signal CLK2 if the second transistor M2 is in an on state, e.g., in the exemplary embodiment illustrated in FIGS. 4 and 5, the second clock signal CLK2 has a low level during the evaluation period and thus, if the second transistor M2 is on, the output signal SOUT of the respective S unit may be a low level until one or both of the first and second clock signals CLK1, CLK2 is/are changed.

As described above, a time interval between output pulses of the subsequently operated S units SCUs may be reduced by reducing a high level overlapping period(s) of the first and second clock signals CLK1, CLK2. As discussed above, in embodiments of the invention if the previous operation was a precharge operation, then during the subsequent overlapping high level period, the output of the respective S unit SCU during the precharge operation may be maintained. In such embodiments, if the previous operation was an evaluation operation, then during the subsequent overlapping high level period, the output of the respective S unit SCU maybe a high level signal.

Referring to FIG. 5, an input signal INPUT input into the first S unit SCU of the first scan driver may include a period when an initial precharge is carried out twice. Therefore a low level scan signal may be continuously supplied twice to each of the scan lines or each of the C units CCUS of the second scan driver 320. For example, referring to FIG. 5, for the first scan line S1, a low level scan signal may be supplied during first and third time periods T1, T3, for the second scan line S2, a low level scan signal may be supplied during second and fourth time periods T2, T4, and for the third scan line S3, a low level scan signal may be supplied during third and fifth time periods T3, T5.

Figure 6:
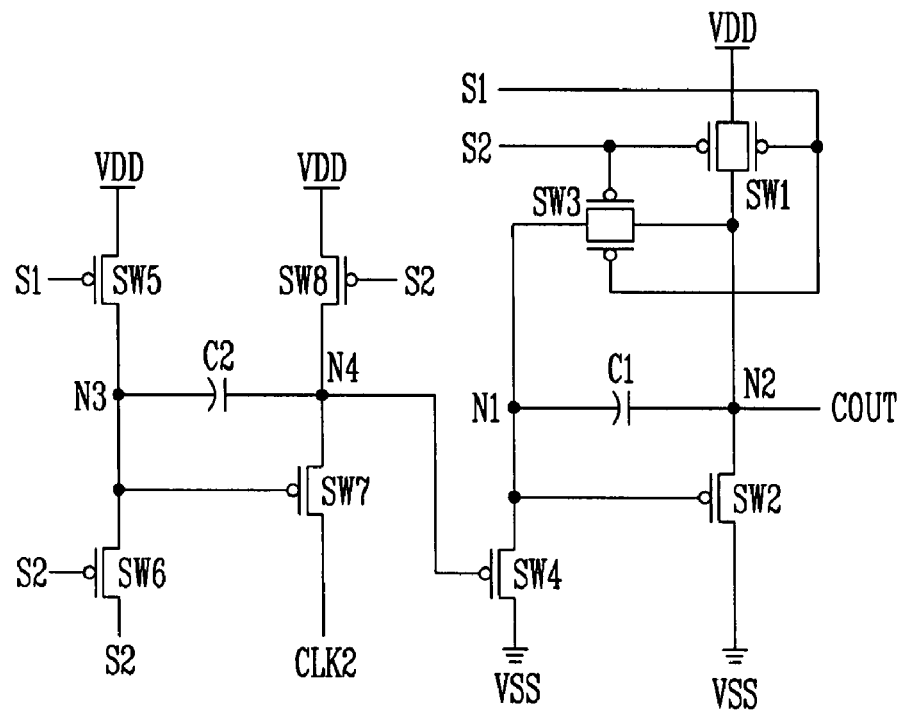
FIG. 6 illustrates a circuit diagram of a first exemplary embodiment of a C unit (CCU) of a second scan driver of the scan driving circuit shown in FIG. 3.

FIG. 6 illustrates a circuit diagram of a first exemplary embodiment of a C unit (CCU) of the second scan driver 320 of the scan driving circuit 300 shown in FIG. 3.

More particularly, in the following description, the exemplary circuit diagram of a C unit CCU may be described as being a first C unit CCU of the second scan driver 320. The first and/or second clock signal CLK1, CLK2, and scan signals S1, S2 output from the first and second S units SCUs of the first scan driver 310 may be input into the first C unit CCU of the second scan driver 320.

Referring to FIGS. 5 and 6, the C unit CCU of the second scan driver 320 may include a plurality of switching elements SW1 to SW8, a first node N1, an output terminal N2 that may correspond to the output terminal COUT of the C unit CCU, a third node N3, first and second capacitors C1, C2, and a fourth node N4.

The first to fourth switching elements SW1 to SW4 may be, e.g., PMOS transistors. Each of the first and third switching elements SW1, SW3 may be realized by, e.g., a transistor having a transmission gate structure realized by connecting two transistors, and therefore may include one source, one drain, a first gate and a second gate. The second and fourth switching elements SW2, SW4 may be realized by one transistor.

The first switching element SW1 may be connected between a first power supply VDD and the output terminal N2. The second switching element SW2 may be connected between the output terminal N2 and a second power supply VSS. The first capacitor C1 may have a first terminal connected to the output terminal N2 and a second terminal connected to the first node N1. The first node N1 may be connected to a gate electrode of the second switching element SW2.

The third switching element SW3 may have a first terminal, e.g., the source terminal, connected to the output terminal N2 and a second terminal, e.g., the drain terminal, connected to the first node N1, a first gate electrode connected to a first gate terminal of the first switching element SW1, and a second gate electrode connected to a second gate electrode of the first switching element SW1.

A first terminal, e.g., the source of the first switching element SW1 may be connected to the first power supply VDD, and a second terminal, e.g., the drain of the first switching element SW1 may be connected to the output terminal N2. A first scan signal S1 output from the first scan driver 310 may be transferred to the first gate electrode of the first and second switching elements SW1, SW3, and a second scan signal S2 output from the first scan driver 310 may be transferred to the second gate electrode of the first and second switching elements SW1, SW3. This first switching element SW1 may form a first path for supplying a first voltage into the output terminal N2 depending on the first or second scan signal S1 or S2.

The third switching element SW3 may supply the first power supply VDD, supplied via the first switching element SW1, to the first node N1 depending on the first or second scan signal S1 or S2. The third switching element SW3 may be turned on by a low level of the first or second scan signal S1 or S2 to make an identical or substantially identical voltage between a gate and a source of the second switching element SW2, and therefore the third switching element SW3 may function to interrupt a second path that may be formed by the second switching element SW2.

The gate of the second switching element SW2 may be connected to the first node N1, a source thereof may be connected to the output terminal N2, and a drain thereof may be connected to the second power supply VSS. This second switching element SW2 may form the second path for supplying the second power supply VSS to the output terminal N2 depending on a voltage of the first node N1, i.e., at the gate thereof. The first power supply VDD may have a higher voltage level than that of the second power supply VSS.

The fourth switching element SW4 may include a first terminal, e.g., a source terminal, connected to the first node N1 and a second terminal, e.g., a drain terminal, connected to the second power supply VSS and may have a gate electrode connected to the fourth node N4, i.e., an output terminal of a conversion unit. The first power supply VDD may have a higher voltage level than that of the second power supply VSS.

The conversion unit may include the fifth through eighth switching elements SW5, SW6, SW7, SW8, the second capacitor C2, the third node N3, and the fourth node N4.

The fifth switching element may have a first terminal, e.g., a source terminal, connected to the first power supply VDD, a second terminal, e.g., a drain terminal, connected to the third node N3, and a gate terminal connected to the first scan signal S1. The sixth switching element SW6 may have a first terminal, e.g., a source terminal, connected to the third node N3 and a second terminal, e.g., a drain terminal, and a gate terminal connected to the second scan signal S2.

The seventh switching element SW7 may have a first terminal, e.g., a source terminal, connected to the fourth node N4, i.e., the conversion unit output terminal, a second terminal, e.g., a drain terminal, connected to the second clock signal CLK2, and a gate terminal connected to the third node N3.

The eighth switching element SW8 may include a first terminal, e.g., a source terminal, connected to the first power supply VDD, a second terminal, e.g., a drain terminal, connected to the fourth node N4, and a gate terminal connected to the second scan signal S2.

The second capacitor C2 may be connected between the third node N3 and the fourth node N4, i.e., the conversion unit output terminal.

In the exemplary embodiment illustrated, which corresponds to the first C unit CCU of the second scan driver 320 illustrated in FIG. 3, certain connections, e.g., connections to the first and second scan signals S1, S2 and/or the first and second clock signals CLK1, CLK2, correspond to the exemplary first C unit CCU of the second scan driver 320. Persons of ordinary skill in the art would appreciate how the exemplary first C unit CCU illustrated in FIG. 5 may be applied to and/or employed by other C units CCUs of the exemplary second scan unit 320. More particularly, in the exemplary embodiment of a first C unit CCU illustrated in FIG. 6, the gate electrode of the fifth switching element SW5 is connected to an input of the C unit CCU through which it may receive the first scan signal S1 from the respective S unit(s) SCUs of the first scan driver 310, and gate electrodes of the sixth switching element SW6 and the eighth switching element SW8 are connected to an input line of the C unit CCU through which they may receive the second scan signal S2 from the respective S unit(s) SCUs of the first scan driver 310.

Further, in embodiments of the invention, the fourth switching element SW4 may be controlled by a voltage state of the output signal of the conversion unit supplied to the fourth terminal N4 thereof.

As discussed above, the first terminal of the first capacitor C1 may be connected to the output terminal N2 and the second terminal thereof may be connected to the first node N1. The first capacitor C1 may function to store a voltage between the gate and the source terminals of the second switching element SW2 depending on a switching operation of the fourth switching element SW4, and may switch the second switching element SW2 depending on a voltage between the gate and the source of the second switching element SW2. The first capacitor C1 may continuously maintain the second path by maintaining a turn-on state (ON) of the second switching element SW2 depending on a switching operation of the fourth switching element SW4.

An exemplary operation of the exemplary C unit CCU of the second scan driver 320 will be described below in conjunction with FIGS. 5 and 6.

The first switching element SW1 and the third switching element SW3 may remain in a turned-on state (ON) during the first and third periods T1, T3 during which the first scan signal S1 is input at a low level and the second scan signal S2 is input at a high level, and may remain in a turned-on state (ON) during the second and fourth periods T2, T4 during which the first scan signal S1 is input at a high level and the second scan signal S2 is input at a low level. During the first, second, third and fourth periods T1, T2, T3, T4, the fourth switching element (SW4) may remain turned off because the voltage at the fourth node N4, i.e., at the output of the conversion unit may be a high level during the first, second, third and fourth periods T1, T2, T3, T4.

Accordingly, the first power supply VDD may be supplied to the output terminal N2 through the first switching element SW1, and then supplied to the first node N1 through the first switching element SW1 and the third switching element SW3. Accordingly, a voltage level of the first power supply VDD may be output to the output terminal N2 during the first, second, third and fourth periods T1, T2, T3, T4.

If the first power supply VDD is transferred respectively to the source and the gate of the second switching element SW2 by the third switching element SW3, and a voltage difference between the gate and the source of the second switching element SW2 becomes "0", then a path between the source and the drain of the second switching element SW2, a static current does not flow to the second power supply VSS through the output terminal N2 and the second switching element SW2.

Accordingly, in embodiments of the invention, power consumption may be reduced by interrupting a static current path by making a voltage level difference between the gate and the source of the second switching element SW2 be "0" using the third switching element SW3 during the period when the first voltage level of the first power supply VDD is output from the output terminal N2.

The fourth node N4, i.e., the output of the conversion unit may be maintained at a high level during the periods T' when the first scan signal S1 and the second scan signal S2 are overlapped at a high level. Therefore, even when the first, third and fourth switching elements SW1, SW3, SW4 are turned off, the output of the previous period may be maintained and the voltage level of the first power supply VDD may be output to the output terminal N2.

Subsequently, the first and third switching elements SW1, SW3 may be turned off, and the fourth switching element SW4 may be turned on because the conversion unit may output at a low level during a fifth period T5 when the first and second scan signals S1, S2 are applied at a high level, and the second clock signal CLK2 has a low level and is applied to the fourth node N4 via the seventh switching transistor S7.

A voltage greater than the absolute value |Vth| of the threshold voltage of the second switching element SW2 may then be applied between the second terminal and the first terminal of the first capacitor C1, namely between the source and the gate of the second switching element SW2 because a voltage of the first node N1 may be reduced as the fourth switching element SW4 is turned on. The second switching element SW2 may then be turned on when the second power supply voltage VSS is applied to the gate thereof.

Subsequently, as the voltage of the first node N1 may further be reduced, if the voltage between the source and the gate of the fourth switching element SW4 has a value less than the absolute value of the threshold voltage of the fourth switching element SW4, then the fourth switching element SW4 may be turned off.

If the fourth switching element SW4 is turned off, then the first terminal of the capacitor C1 may be floated, and therefore the voltage stored in the first capacitor C1 may be maintained. Accordingly, the voltage stored between the second terminal and the first terminal of the first capacitor C1 may completely drop to the voltage of the second power supply VSS, and may maintain the second switching element SW2 in a turned-on state so that a voltage of the output terminal N2 may reach a voltage level of the second power supply VSS because the voltage stored between the second terminal and the first terminal of the first capacitor C1 may maintain a voltage greater than the absolute value of the threshold voltage of the second switching element SW2.

That is to say, the C unit CCU of the second scan driving circuit 320 according to one exemplary embodiment of the present invention may reduce a current leakage by interrupting a static current path of the second switching element SW2 during the period when a voltage level of the first power supply VDD is output using the third switching element SW3, and also outputs a voltage level of the second power supply VSS making, e.g., a full drop by maintaining a turned-on state of the second switching element SW2 using the first capacitor C1.

As a result, the C unit CCU of the second scan driver 320 may output the voltage level of the first power supply VDD and the voltage level of the second power supply VSS, which may make a full voltage swing, and also reduce an amount of power consumption by reducing current leakage from a static current of the PMOS transistor.

Also, an emission control signal output through the C unit CCU of the second scan driving circuit may make a full or substantially full voltage swing between the voltage level of the first power supply and the voltage level of the second power supply, and therefore the image displaying unit 100 may more efficiently operate after it receives the emission control signal.

FIG. 7A to FIG. 7E illustrate circuit diagrams of second to sixth exemplary embodiments of a second scan driver employable by, e.g., the scan driving circuit 300 shown in FIG. 3.

The same reference numerals used for describing elements of the exemplary C unit illustrated in FIG. 6 are used for similar elements in the following description of the second through sixth exemplary embodiments, and only differences between the respective exemplary embodiment(s) will be described below.

Each of the embodiments as shown in FIG. 7 has the same operation and configuration as those of the exemplary C unit of the second scan driver 320 shown in FIG. 6, except that a signal input into the conversion unit thereof is different.

As discussed above, the conversion unit may include the fifth switching element SW5 connected between the first power supply VDD and the third node N3, the sixth switching element SW6 connected between the third node N3 and a first input terminal, the seventh switching element SW7 connected between the fourth node N4, i.e., the conversion unit output terminal and a second input terminal and having a gate electrode connected to the third node N3, the eighth switching element SW8 connected between the first power supply VDD and the conversion unit output terminal N4, and the second capacitor C2 connected between the third node N3 and the conversion unit output terminal N4.

Figure 7A:
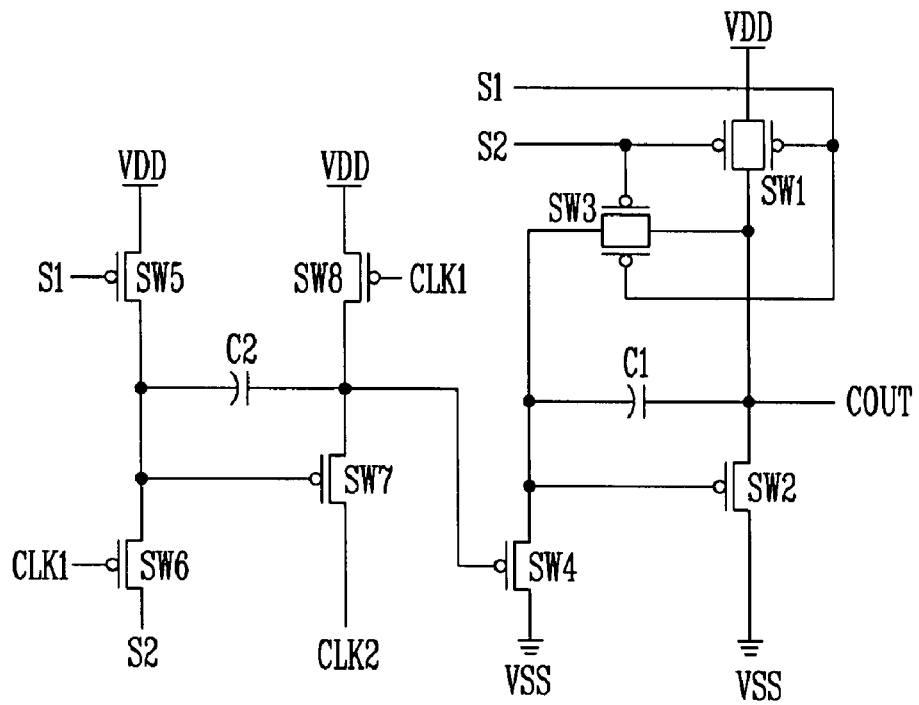
FIG. 7A to FIG. 7E illustrate circuit diagrams of second to sixth exemplary embodiments of a C unit (CCU) of the second scan driver of the scan driving circuit shown in FIG. 3.

In the second exemplary embodiment illustrated in FIG. 7A, a gate electrode of the sixth switching element SW6 and a gate electrode of the eighth switching element SW8 are connected to an input line of the first clock signal CLK1 instead of an input line of the second scan signal S2 as in the first exemplary embodiment illustrated in FIG. 6.

Figure 7B:
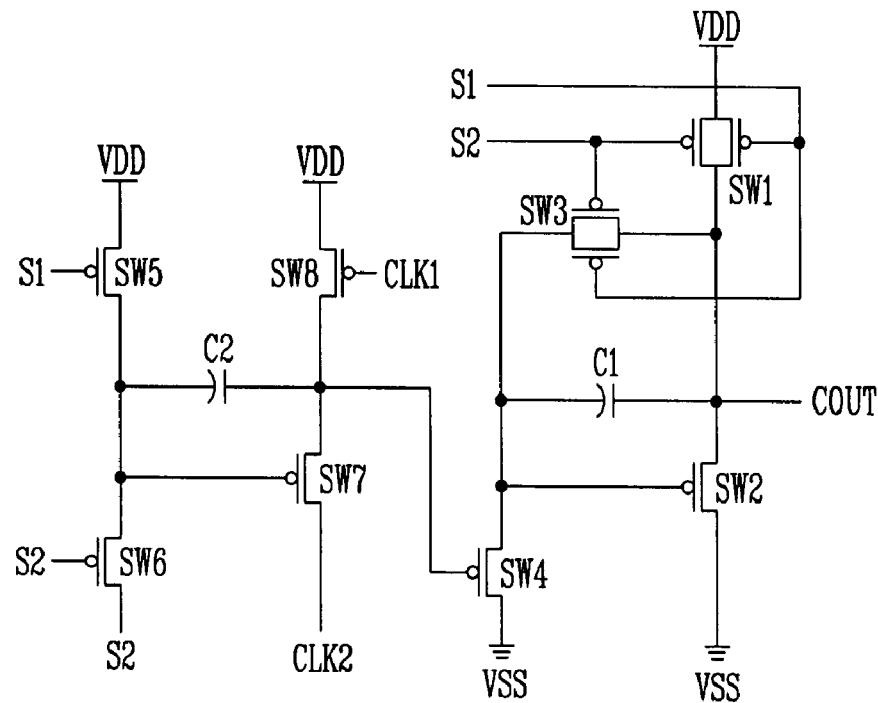

In the third exemplary embodiment illustrated in FIG. 7B, a gate electrode of the sixth switching element SW6 may be connected to an input line of the second scan signal S2, and a gate electrode of the eighth switching element SW8 may be connected to an input line of the first clock signal CLK1.

Figure 7C:
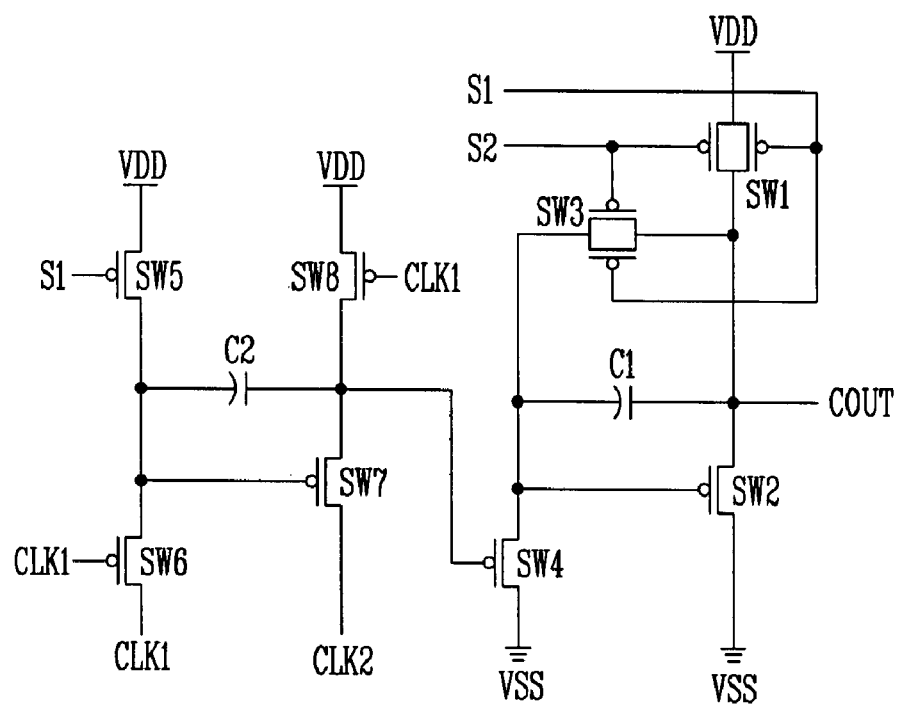

In the fourth exemplary embodiment illustrated in FIG. 7C, gate electrodes of the sixth switching element SW6 and the eighth switching element SW8 may be connected to an input line of the first clock signal CLK1, and the first clock signal CLK1 instead of the second scan signal S2 may be input into the first input terminal.

Figure 7D:
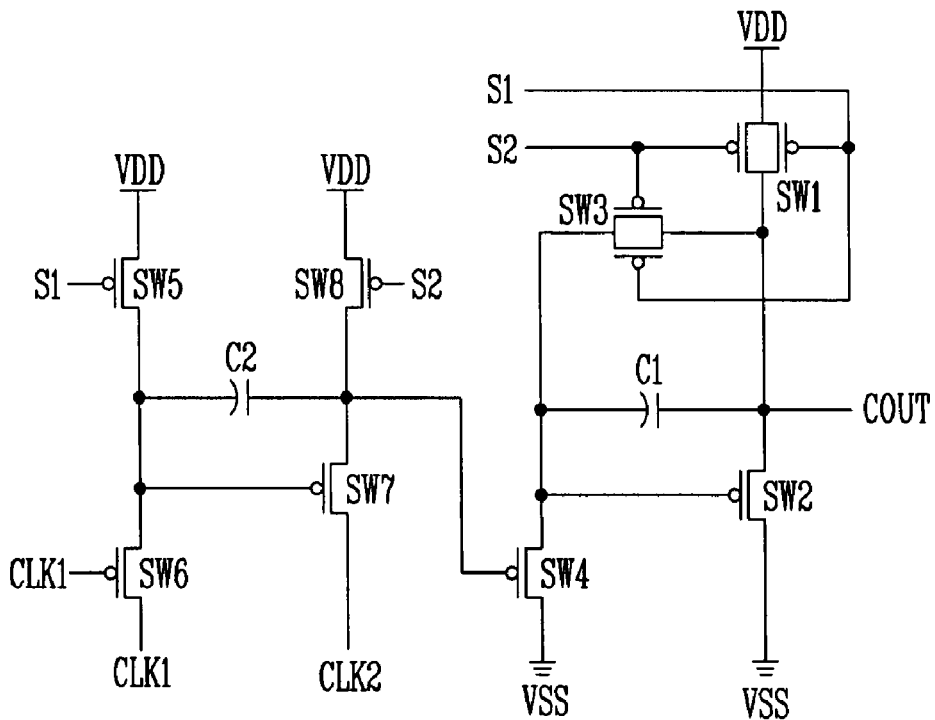

It is the fifth exemplary embodiment illustrated in FIG. 7D, a gate electrode of the sixth switching element SW6 is connected to an input line of the first clock signal CLK1, a gate electrode of the eighth switching element SW8 may be connected to an input line of the second scan signal S2, and the first clock signal CLK1 may be input into the first input terminal.

Figure 7E:
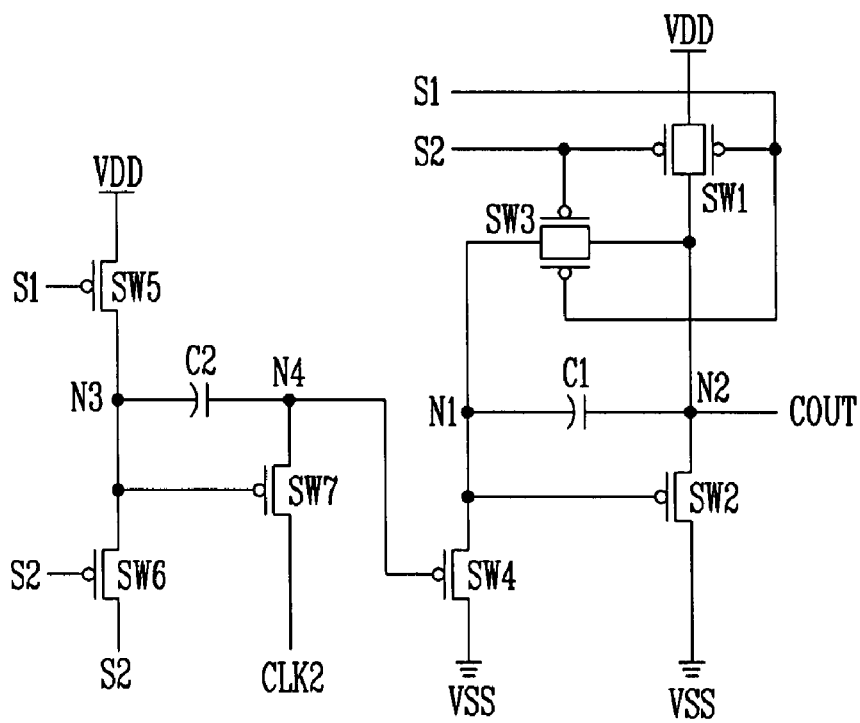

Also, the eighth switching element SW8 may be omitted, as in the case of the exemplary embodiment illustrated in FIG. 7E. In some embodiments of the invention, various signals may be input into the gate electrode of the sixth switching element, the first input terminal and the second input terminal, as described above.

As described above, a scan driving circuit according to one or more aspects of the present invention may be advantageous in that it may minimize an amount of power consumption because it may compensate for a non-uniform luminance by compensating for a threshold voltage of a transistor, may generate an emission control signal by the scan signal, may include the second scan driver having a low power consumption, and may remove a path through which a static current may flow.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A scan driving circuit, comprising:
   a first scan driver including a plurality of first units, the first units receiving an input signal or an output voltage of a previous first unit and first and second clock signals to output a scan signal;
   a second scan driver having a plurality of second units, the second units receiving a plurality of scan signals output from respective ones of the first units, and at least one of the first and second clock signals, and outputting an emission control signal;
   each of the first units of the first scan driver comprises;
   a first transistor including a first terminal receiving an output voltage of a previously operated first unit or initial input signal, a gate terminal connected to a first clock terminal, and a second terminal;
   a second transistor including a gate terminal connected to the second terminal of the first transistor, a first terminal connected to a second clock terminal, and a second terminal connected to an output terminal for outputting the respective scan signal;
   a third transistor including a gate terminal connected to the first clock terminal, a first terminal connected to a first node, and a second terminal connected to a second power supply;
   a fourth transistor including a gate terminal connected to the second terminal of the first transistor, a first terminal connected to the first clock terminal, and a second terminal connected to the first node; and
   a fifth transistor including a gate terminal connected to the first node, a first terminal connected to a first power supply, and a second terminal connected to the output terminal.

2. The scan driving circuit as claimed in claim 1, wherein the two scan signals are sequentially output from respective ones of the first units.

3. The scan driving circuit as claimed in claim 1, further comprising a first capacitor connected between the second terminal of the first transistor and the output terminal.

4. The scan driving circuit as claimed in claim 1, wherein each of the first, second, third, fourth and fifth transistors is a P-type transistor.

5. The scan driving circuit as claimed in claim 1, wherein each of the first units of the first scan driver including a first clock terminal and a second clock terminal, the first clock terminal receiving one of a first clock signal and a second clock signal, and the second clock terminal receiving the other of the first clock signal and the second clock signal.

6. The scan driving circuit as claimed in claim 5, wherein the first clock signal is supplied to the first clock terminal of odd-numbered first units of the first scan driver, and the second clock signal is supplied to the second clock terminal of odd-numbered first units of the first scan driver.

7. The scan driving circuit as claimed in claim 5, wherein the second clock signal is supplied to the first clock terminal of even-numbered first units of the first scan driver, and the first clock signal is supplied to the second clock terminal of the even-numbered first units of the first scan driver.

8. The scan driving circuit as claimed in claim 5, wherein a precharge is carried out during a period when the first clock signal is input at a low level and the second clock signal is input at a high level, and an evaluation is carried out during a period when the first clock signal is input at a high level and the second clock signal is input at a low level.

9. The scan driving circuit as claimed in claim 5, wherein the first clock signal and the second clock signal have a reversed phase relationship, and overlap each other at a high level such that the first and second clock signals are high level signals during at least one predetermined period of time.

10. The scan driving circuit as claimed in claim 9, wherein:
    during the precharge period, a high level is output from the first respective first unit, and during the evaluation period, a level of a signal corresponding to the input received during the precharge period is output from the respective first unit,
    when the first and second clock signals are overlapped at a high level, a previous output is maintained if the overlapping high level period of the first and second clock signals followed a precharge period, and
    when the first and second clock signals are overlapped at a high level, a high level is output if the overlapping high level period of the first and second clock signals followed an evaluation period.

11. The scan driving circuit as claimed in claim 1, wherein each of the second units of the second scan driver comprises:
    a first switching element connected between the first power supply and an output terminal for outputting the respective emission control signal;

a second switching element including a first terminal connected to the output terminal and a second terminal connected to the second power supply;
a first capacitor connected to a first node connected to a gate terminal of the second switching element and the output terminal;
a third switching element including a first terminal connected to the first node, a second terminal connected to the output terminal, the third switching element receiving the plurality of scan signals; and
a fourth switching element including a first terminal connected to the first node and a second terminal connected to the second power supply, and having a gate terminal connected to an output terminal of a conversion unit.

12. The scan driving circuit as claimed in claim 11, wherein each of the first and third switching elements is realized by a transistor having a transmission gate structure realized by connecting two transistors.

13. The scan driving circuit as claimed in claim 11, wherein the conversion unit comprises:
a fifth switching element including a first terminal connected to the first power supply and a second terminal connected to a third node;
a sixth switching element including a first terminal connected to the third node;
a seventh switching element including a first terminal connected to an output terminal of the conversion unit, and a gate terminal connected to the third node; and
a second capacitor connected between the third node and the output terminal of the conversion unit.

14. The scan driving circuit as claimed in claim 13, further comprising an eighth switching element including a first terminal connected to the first power supply and a second terminal connected to the output terminal of the conversion unit.

15. The scan driving circuit as claimed in claim 14, wherein a gate electrode of the eighth switching element is connected to a scan signal input line for receiving one of the scan signals or an input line for receiving the first clock signal.

16. The scan driving circuit as claimed in claim 15, wherein the first, second, third, fourth, fifth, sixth, seventh and eighth switching elements are P-type elements.

17. The scan driving circuit as claimed in claim 13, wherein a gate electrode of the fifth switching element is connected to a scan signal input line for receiving one of the plurality of scan signals, and a gate electrode of the sixth switching element is connected to a second scan signal input line for receiving another one of the plurality of scan signals or an input line for receiving the first clock signal.

18. The scan driving circuit as claimed in claim 13, wherein:
a second terminal of the sixth switching element is connected so as to receive one of the scan signals other than a respective one of the scan signals supplied to the fifth switching element or the first clock signal;
a gate terminal of the sixth switching element is connected so as to receive one of the scan signals other than a respective one of the scan signals supplied to the fifth switching element or the first clock signal; and
a second terminal of the seventh switching element is connected so as to receive the second clock signal.

19. A light emitting display, comprising:
a pixel unit including a plurality of pixels connected with respective ones of signal lines, data lines and emission signal lines;
a data driving circuit supplying a respective data signal into the data lines; and
a scan driving circuit including:
a first scan driver including a plurality of first units, the first units receiving an input signal or an output voltage of a previous first unit and first and second clock signals to output a scan signal, and
a second scan driver having a plurality of second units, the second units receiving a plurality of scan signals output from respective ones of the first units, and at least one of the first and second clock signals, and outputting an emission control signal
each of the first units of the first scan driver comprises;
a first transistor including a first terminal receiving an output voltage of a previously operated first unit or initial input signal, a gate terminal connected to a first clock terminal, and a second terminal;
a second transistor including a gate terminal connected to the second terminal of the first transistor, a first terminal connected to a second clock terminal, and a second terminal connected to an output terminal for outputting the respective scan signal;
a third transistor including a gate terminal connected to the first clock terminal, a first terminal connected to a first node, and a second terminal connected to a second power supply;
a fourth transistor including a gate terminal connected to the second terminal of the first transistor, a first terminal connected to the first clock terminal, and a second terminal connected to the first node; and
a fifth transistor including a gate terminal connected to the first node, a first terminal connected to a first power supply, and a second terminal connected to the output terminal.

* * * * *